(12) United States Patent
Goinga

(10) Patent No.: US 8,975,890 B2
(45) Date of Patent: Mar. 10, 2015

(54) DC AND AC CURRENT DETECTION CIRCUIT

(75) Inventor: Ydo Goinga, Borne (NL)

(73) Assignee: Shakira Limited, Ballinasloe (IE)

( * ) Notice: Subject to any disclaimer, the term of this patent is extended or adjusted under 35 U.S.C. 154(b) by 252 days.

(21) Appl. No.: 13/820,917

(22) PCT Filed: Sep. 21, 2011

(86) PCT No.: PCT/EP2011/066450
§ 371 (c)(1),
(2), (4) Date: Mar. 5, 2013

(87) PCT Pub. No.: WO2012/038478
PCT Pub. Date: Mar. 29, 2012

(65) Prior Publication Data
US 2013/0162242 A1  Jun. 27, 2013

(30) Foreign Application Priority Data

Sep. 21, 2010  (IE) .................................. S2010/0604

(51) Int. Cl.
*G01R 15/18*  (2006.01)
(52) U.S. Cl.
CPC .................................... *G01R 15/183* (2013.01)
USPC ...................................................... 324/127
(58) Field of Classification Search
USPC ........................................................ 324/127
See application file for complete search history.

(56) References Cited

U.S. PATENT DOCUMENTS

| | | | |
|---|---|---|---|
| 3,768,011 A | 10/1973 | Swain | |
| 4,293,813 A | 10/1981 | Groenenboom | |
| 5,223,789 A | 6/1993 | Katsuyama et al. | |
| 5,508,606 A * | 4/1996 | Ryczek | 324/117 R |
| 7,530,277 B2 * | 5/2009 | Miyasaka et al. | 73/856 |
| 2001/0050552 A1 | 12/2001 | Sandquist et al. | |
| 2007/0108992 A1 * | 5/2007 | Yanagisawa | 324/658 |
| 2012/0051108 A1 * | 3/2012 | Leu et al. | 363/126 |

FOREIGN PATENT DOCUMENTS

JP  H02-287266 A  11/1990
WO  2009/024692 A1  2/2009

OTHER PUBLICATIONS

International Search Report and Written Opinion for PCT/EP2011/066450, mailed Dec. 20, 2011.

* cited by examiner

*Primary Examiner* — Arleen M Vazquez
*Assistant Examiner* — Feba Pothen
(74) *Attorney, Agent, or Firm* — Withrow & Terranova, P.L.L.C.

(57) ABSTRACT

A circuit for detecting a DC current in a conductor (L1) includes a current transformer (CT) having a ferromagnetic core (10), a primary winding comprising the conductor (L1) and at least one secondary winding (W1). The circuit further includes an oscillator (12) for supplying an oscillating signal across the secondary winding and means for detecting a dc offset in the current flowing in the oscillator circuit. The circuit includes a capacitor (C1) in series with the secondary winding, and the detecting means is arranged to detect a non-zero voltage across the capacitor above a certain level.

7 Claims, 6 Drawing Sheets

DC AND AC CURRENT DETECTION CIRCUIT

This application is a 35 USC 371 national phase filing of PCT/EP2011/066450, filed Sep. 21, 2011, which claims priority to Irish national application S2010/0604, filed Sep. 21, 2010, the disclosures of which are incorporated herein by reference in their entireties.

FIELD OF THE DISCLOSURE

This invention relates to a circuit for detecting DC and in some embodiments AC currents.

BACKGROUND

It is often desirable to detect DC currents in circuits or installations. Detection of DC currents is often achieved by the use of a shunt. Shunts have to be inserted in the circuit being monitored and this involves direct contact with the DC supply. In many cases direct contact with the circuit being monitored is undesirable or even impractical. Hall Effect devices are also commonly used for detection of DC currents, but these tend to be bulky and expensive.

Current transformers (CTs) are not normally used to detect DC currents because CTs are only responsive to alternating currents and are not inherently responsive to a steady state current. However, current transformers have the advantage of being compact and inexpensive, and would be an attractive means for achieving contactless detection of DC currents if the above technical problem could be overcome.

It is an object of the invention to provide a simple circuit using a current transformer to detect a DC current.

SUMMARY

According to the present invention there is provided a circuit for detecting a DC current in at least one conductor, the circuit including a current transformer having a ferromagnetic core, a primary winding comprising the conductor and at least one secondary winding, the circuit further including an oscillator for supplying an oscillating signal across the secondary winding and means for detecting a dc offset in the current flowing in the secondary winding.

The term "winding" is used in relation to the primary in accordance with conventional terminology, even though the primary may constitute a single conductor passing through a current transformer core.

The detection circuit may be configured to detect AC currents as well as DC currents if the oscillator frequency is sufficiently high compared to the frequency of the current to be detected, preferably at least an order of magnitude higher.

The primary winding may comprise more than one conductor, in which case the circuit will detect the vector sum of the currents flowing in the primary conductors. In such a case the circuit may be used as a residual current device.

In preferred embodiments the circuit includes at least one capacitor in series with the secondary winding, wherein the detecting means is arranged to detect a non-zero voltage across the capacitor above a certain level, the non-zero voltage corresponding to a dc offset greater than a predetermined magnitude.

BRIEF DESCRIPTION OF THE DRAWINGS

Embodiments of the invention will now be described, by way of example, with reference to the accompanying drawings, in which.

DETAILED DESCRIPTION

Figure 1:
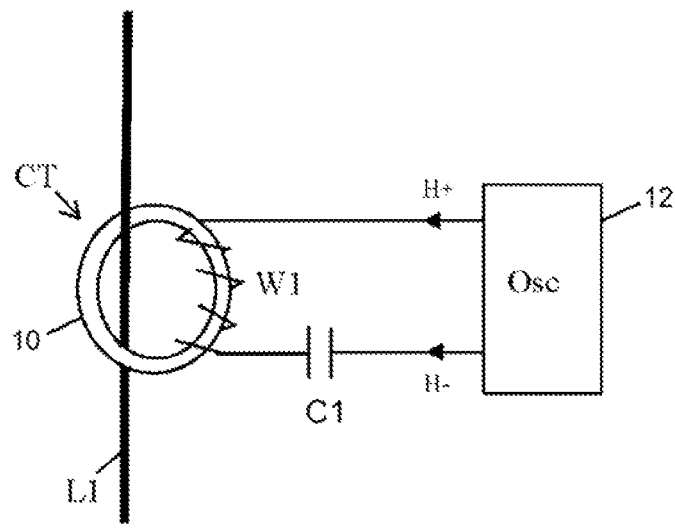
FIG. 1 is a basic circuit illustrating the principle of operation of the embodiments of the invention.

FIG. 1 shows a current transformer CT having a toroidal ferromagnetic core 10, a secondary winding W1 wound on the core, and a primary winding in the form of a single conductor L1 passing through the core aperture. The secondary winding W1 is connected to an oscillator 12, with a capacitor C1 connected in series with W1. The oscillator 12 produces an alternating current H at frequency F1 which causes a current H to flow through W1 and C1. As the current H will flow alternately in one direction and then in the opposite direction, the opposite directions of current flow can be represented by currents H+ and H−. When H+ is increased from zero, the core 10 will be magnetised, and this magnetisation will increase until the core reaches magnetic saturation. If H+ is initially reduced and then reversed as represented by H−, the core 10 will be brought out of saturation and then the magnetisation of the core will be reversed until the core reaches saturates again in the opposite direction. This behaviour is represented in FIG. 2a.

Figure 2A:
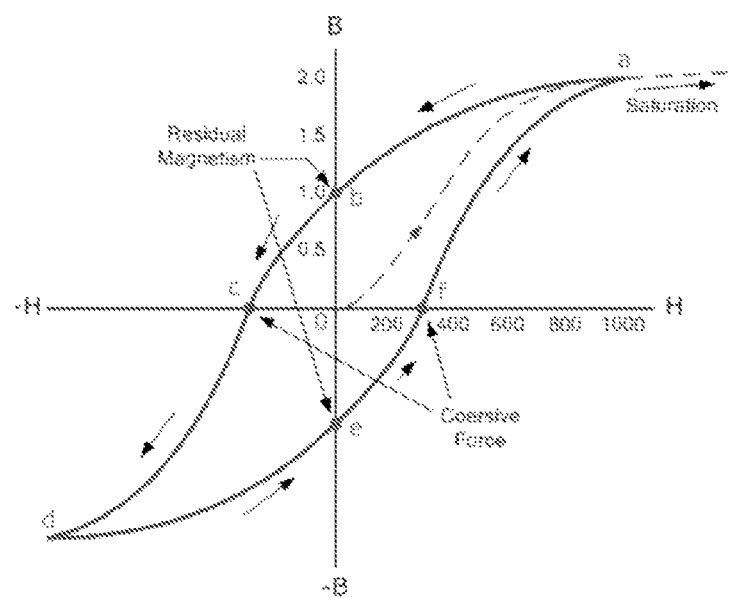
FIG. 2a shows a typical hysteresis curve plotted for a ferromagnetic material.

The plot of FIG. 2a is known as a B–H (hysteresis) loop, where H is the current required to magnetise the core and B is the magnetic flux produced by current H. It can be seen that current H+ starts from zero at point 0 and is increased with a positive polarity until magnetic saturation occurs at point a (positive saturation), at which point H+ is reduced and then reversed to become H− to take the hysteresis loop from point a through point b through point c to negative saturation point d. The current is again reduced and then reversed to become H+ which takes the loop from point d through point e through point f and back to point a again.

This process will continue in an oscillatory manner as determined by frequency F1 which, in order to detect AC as will be described, will normally be substantially higher than normal mains supply frequency of 50 or 60 Hz, e.g. at least an order of magnitude higher and preferably at least 1500 Hz and most preferably around 3 KHz. It can be seen that after the initial saturation point is reached, the core will have a residual magnetism when H is zero, as shown at points b and e. Magnetisation will be zero when current H has a positive or negative value as shown at points c and f.

Figure 2B:
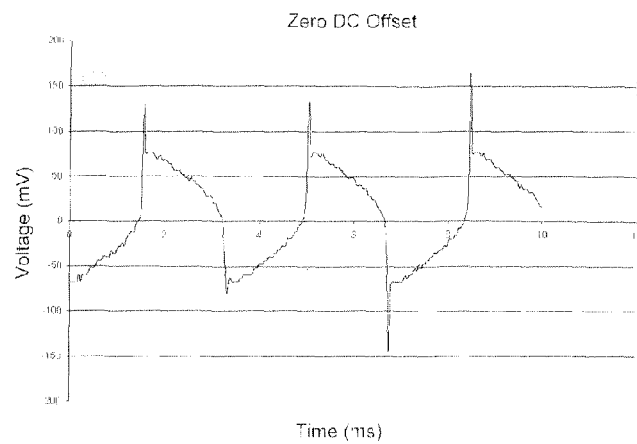
FIGS. 2b to 2d are waveforms showing the effect of DC currents flowing in the primary winding of FIG. 1.

FIG. 2b shows the corresponding waveform for the current flow H in the oscillator circuit. It can be seen that the current reaches a peak in each polarity during each cycle of the oscillator frequency.

Figure 2C:
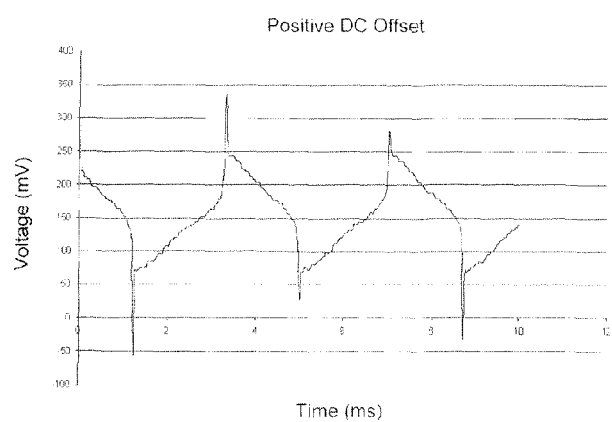
Figure 2D:
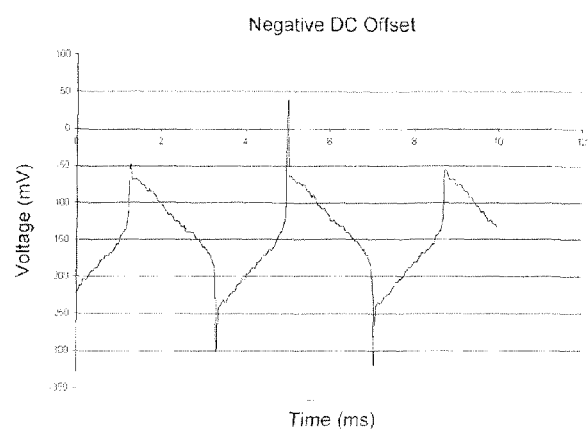

Under normal conditions (no current flowing in L1), the AC current H flowing in the oscillator circuit will have a mean DC value of zero. If a DC current $+I_{dc}$ is passed in a certain direction through the conductor L1 in FIG. 1, the current flowing in the oscillator circuit will be shifted from the mean zero level to a mean positive level as indicated by FIG. 2c, the magnitude of the DC offset being proportional to the DC current flow in L1. Conversely, if the DC current flow in L1 is reversed to become $-I_{dc}$, the DC offset will also be reversed, as shown in FIG. 2d. The DC offset that occurs in the oscillator circuit can be used to detect and measure a DC current flow in the primary conductor L1, as shown in the embodiment of FIG. 3.

Figure 3:
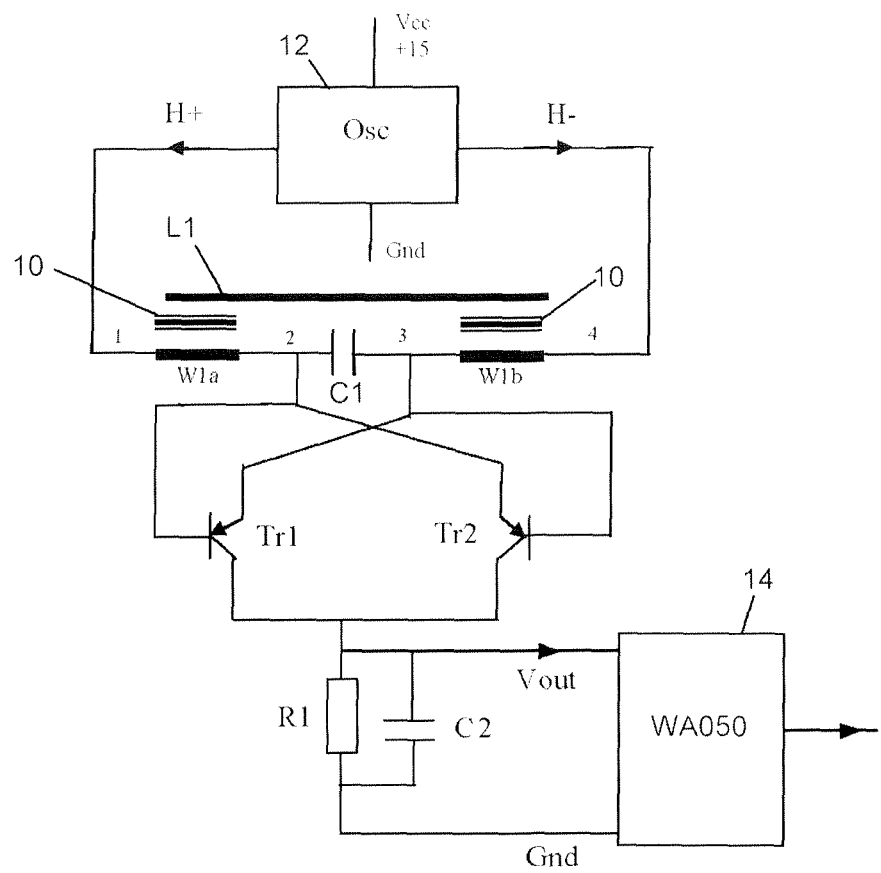
FIG. 3 is a circuit diagram of a first embodiment of the invention.
Figure 4:
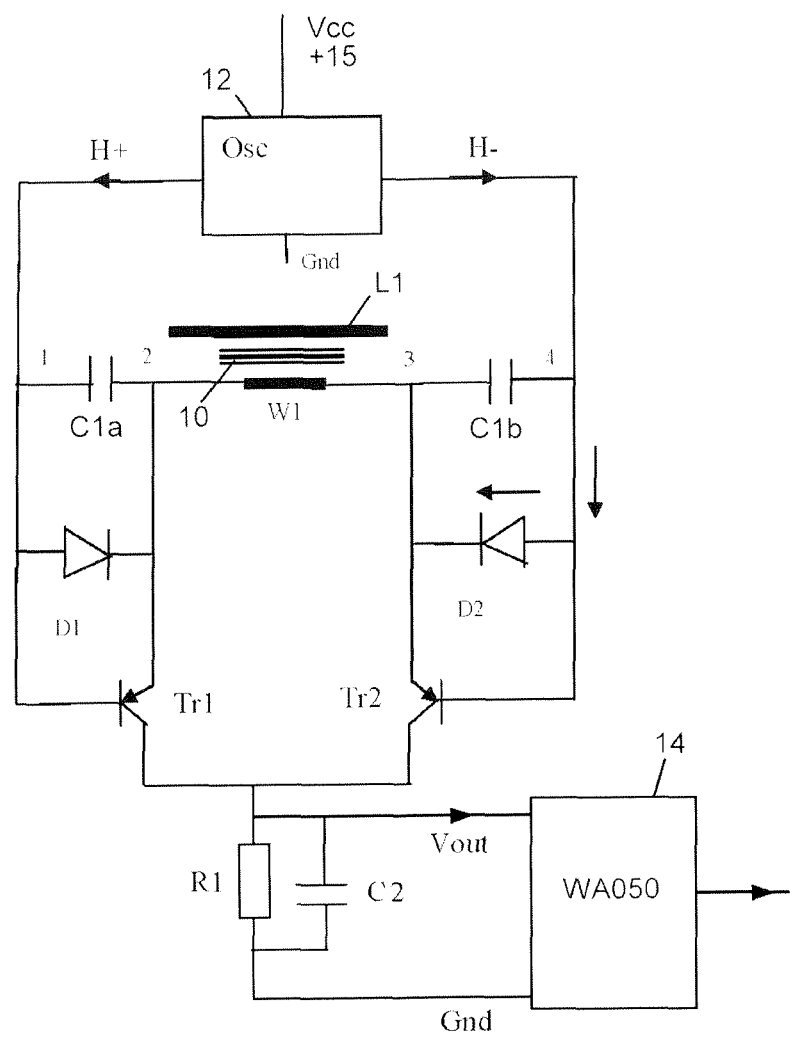
FIG. 4 is a circuit diagram of a second embodiment of the invention.

In FIG. 3 the winding W1 is separated into two secondary windings W1a, W1b wound separately on the core 10, and the capacitor C1 is connected in series between the secondary windings (in FIGS. 3 and 4 the toroidal core 10 is shown schematically). As in FIG. 1 the primary conductor L1 passes through the core aperture. The oscillator 12 is supplied with a 15V supply from Vcc to ground. The oscillator 12, the two windings W1a, W1b and the capacitor C1 form a loop or a first circuit for current flow from Vcc to ground. The oscillator current as represented by H+ and H− will flow back and forth through W1a, C1 and W1b at the oscillator frequency F which, as mentioned, will typically be substantially higher than the normal mains supply frequency of 50 Hz, for example about 3 KHz.

During the positive half cycles Vcc will be distributed approximately as 15V, 7.5V, 7.5V and 0V at points 1, 2, 3 and 4 respectively, and during the negative half cycles Vcc will be distributed approximately as 0V, 7.5V, 7.5V and 15V at points 1, 2, 3 and 4 respectively. So, whilst points 1 and 4 will swing fully between 15V and ground, the voltages at points 2 and 3 will remain relatively stable at 7.5V. In the absence of any current flow in the primary conductor L1 the DC current through the secondary windings and the DC voltage across C1 will be substantially zero. When a DC current $+_{Idc}$ or $-_{Idc}$ flows in the primary circuit a resultant DC shift as shown in FIG. 2c or 2d will occur and the current in the oscillator circuit will now have a DC offset with the result that the voltages at points 2 and 3 will no longer be the same. The resultant differential voltage at those points can be used to control rectifying means (bipolar transistors in the present embodiment) and so detect the DC current in the primary conductor L1.

To this end, a second circuit to ground is formed by bipolar transistors Tr1 and Tr2, a resistor R1 and a further capacitor C2. When a DC current $_{Idc}$ flows in the primary conductor L1 the difference in the DC voltage between points 2 and 3 will increase proportionately. When $_{Idc}$ is of a certain polarity and of sufficient magnitude, corresponding to a DC offset greater than a pre-determined magnitude, point 2 will reach approximately 0.7V higher than point 3 during the oscillator cycles and transistor TR2 will start to conduct. This will allow the DC current to flow to ground via resistor R1 and develop a voltage across R1 and capacitor C2 will charge up to a certain voltage. When $_{Idc}$ is of the same magnitude but of opposite polarity point 3 will reach approximately 0.7V higher than point 2 during the oscillator cycles and transistor TR1 will conduct. The oscillator current will again flow to ground via resistor R1 and develop a voltage across C2. Thus a DC voltage will be developed across C2 which will be proportional to the DC current flowing in L1 and, therefore, to a predetermined magnitude of DC offset in the oscillator circuit.

In the arrangement of FIG. 3 the transistors Tr1 and Tr2 are used to "siphon off" the DC component in the oscillator current by way of a rectifying action so as to detect a DC current flow in the primary conductor, the capacitor C1 allowing the high frequency current produced by the oscillator 12 to bypass the transistors. To this end, Tr1 and Tr2 are used as current control means to control the current flow into C2.

If there is a DC current in L1, the voltage across C1 will always reach a level where Tr1 starts conducting independent of the magnitude of the current and the value of C1. The small capacitor C1 is intended to absorb the AC ripple current, typically at 3 KHz, produced by the oscillator 12. The ripple voltage across C1 stays well below 0.7V. The value of the capacitor C1 is much smaller than that of the capacitor C2 and its part in time delay is negligible. The tripping threshold is adjusted by suitable choice of the values on the components R1, C2 and the number of turns in the windings W1a and W1b.

FIG. 4 shows a second embodiment of the invention wherein a single secondary winding W1 is used but the rectifying means is split and the single capacitor C1 has been replaced by two capacitors C1a and C1b and the secondary winding W1 is connected in series between the capacitors. The oscillator currents H+ and H− now flow through W1 and capacitors C1a and C1b. Under normal conditions (no current flowing in L1) during the oscillator cycles Vcc will be distributed approximately as 15V, 15V, 0V and 0V at points 1, 2, 3 and 4 respectively during positive half cycles, and during the negative half cycles Vcc will be distributed approximately as 0V, 0V, 15V and 15V at points 1, 2, 3 and 4 respectively, and the effective differential voltage across each of C1a and C1b will be zero.

When a DC current of a certain polarity flows in L1 a resultant DC shift as shown in FIG. 2c will occur and capacitors C1a and C1b will acquire a charge. When the differential voltage across each of them reaches about 0.7V a diode D1 and a bipolar transistor Tr2 will conduct and the DC component in the oscillator current will flow from point 1 through D1, through W1 and into the emitter of Tr2, and the resultant collector current of Tr2 will flow into R1 and cause a DC voltage to be developed across C2.

When a DC current of the opposite polarity flows in L1 a resultant DC shift as shown in FIG. 2d will occur and capacitors C1a and C1b will acquire a charge. When the differential voltage across each of them reaches about 0.7V a diode D2 and a bipolar transistor Tr1 will conduct and oscillator current will flow from point 4 through D2, through W1 and into the emitter of Tr1, and the resultant collector current of Tr1 will flow into R1 and cause a DC voltage to be developed across C2.

The main advantage of the arrangement of FIG. 4 is that the CT can now comprise a single winding rather than two windings. However, this advantage is offset to some extent by the fact that it requires a higher conducting threshold of 1.4 V over two capacitors in FIG. 4 compared with 0.7 V over one capacitor in FIG. 3 to achieve the same performance.

The voltage across R1 is smoothed by C2, and the DC voltage Vout developed across R1 will be proportional to the DC current flow in the primary conductor L1. This voltage can be monitored and used for measurement purposes or for detection purposes such as RCD (residual current device) applications where, for example, the DC current flowing in the primary conductor L1 is the difference in the currents in the line and neutral conductors of a mains electricity supply. For example, an electronic circuit 14 comprising an integrated circuit type WA050 may be connected across the resistor R1. The WA050 is an industry standard RCD IC supplied by Western Automation Research & Development Ltd, Ireland.

The circuit arrangements of FIGS. 3 and 4 can also be used to detect AC current flow in the primary conductor L1 at a typical mains supply frequency of 50 Hz. This is because the frequency of the oscillator 12 is sufficiently high compared to the mains frequency, e.g. 3 KHz as compared to 50 Hz, that each half cycle of primary current will be effectively a DC current for the half cycle period, and during this period the oscillator 12 will have completed multiple cycles during which oscillator current will flow through R1. The DC offset in the oscillator current will therefore vary relatively slowly during each half cycle of the primary current. It will be appreciated therefore that circuits according to the invention can be employed to detect AC residual currents or composite AC residual currents with frequencies from 1 Hz up to and approaching any selected oscillator frequency.

By suitable selection of component W1 and C1, the circuit can be optimised to detect DC or AC currents of selected magnitudes flowing in the primary conductor L1.

The circuit can be designed to produce the same DC offset, and accordingly the same level of Vout, for AC and DC currents of approximately the same RMS value, i.e. to have in effect the same response to AC and DC currents, or the circuit can be made less responsive to AC currents without changing the DC detection threshold if discrimination between AC and DC currents is required. This can be done by changing the value of C1 in FIG. 3. For low values of capacitance, AC currents will mainly flow into the emitters of the rectifier transistors. By increasing the value of C1 the circuit will become less responsive to AC currents because an increasing part of the current is needed to charge capacitor C1 to a voltage level Vbe of 0.7 V above which the bipolar transistors start conducting and it will take an AC current of larger magnitude to cause the same level of Vout in comparison to a given DC current.

By suitable selection of the value of capacitor C1, a threshold of detection for AC currents can be set independently of the DC current level and in this way the circuit can be made responsive to DC currents of a certain magnitude whilst being effectively blind to AC currents of a similar or higher magnitude and thereby provide a very high level of discrimination between AC and DC currents.

Similarly, by suitable selection of the values of capacitors C1*a* and C1*b* in FIG. 4, threshold of detection for AC currents can be set independently of the DC current level.

Figure 5:
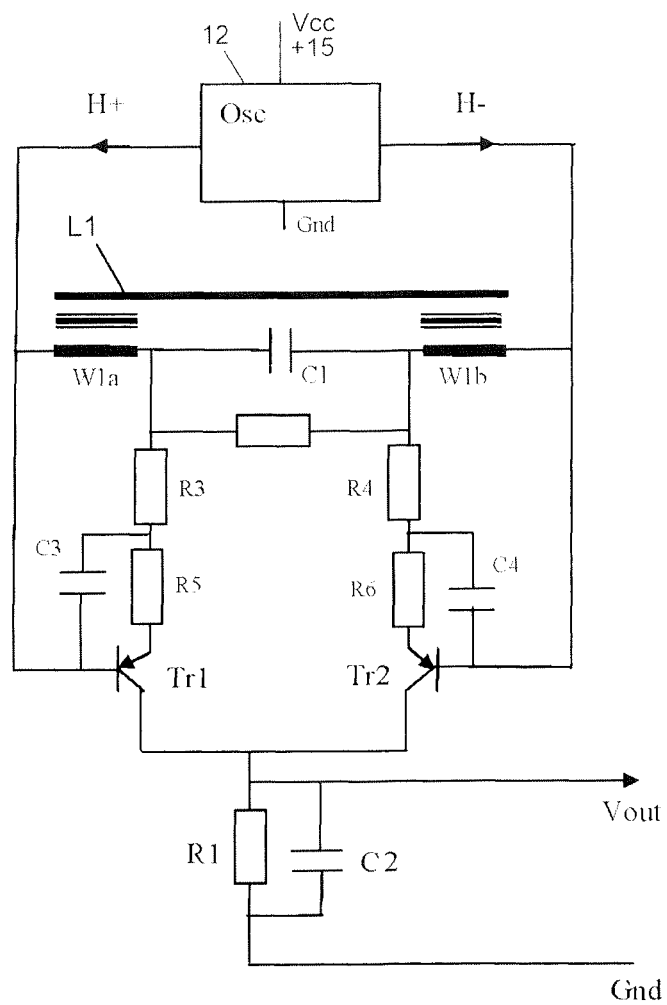
FIG. 5 is a circuit diagram of a third embodiment of the invention.

It may be desirable to set the AC current detection threshold independent of and at a lower value than a corresponding DC current. FIG. 5 shows an embodiment which achieves this.

In FIG. 5, components R3, R5 and C3 (the left chain) have been inserted between C1 and Tr1, and components R4, R6 and C4 (the right chain) have been inserted between C1 and Tr2. In the case of a DC current flow above a certain level in the primary circuit (L1) the offset current produced by C1 will be DC, and a resultant current will flow through the left chain for one polarity of the primary DC current, and through the right chain for a DC current of the opposite polarity. Capacitors C3 and C4 will act as DC blocks, so all of the offset current will be forced to flow via R5 or R6 as applicable. In the case of an AC current flow above a certain level in the primary circuit, the resultant DC offset current produced by C1 will have an AC component, e.g. 50 Hz. For one half cycle of the AC primary current the resultant offset current will flow via the left chain, and it will flow through the right chain for the other half cycle. However, in the case of the AC condition, capacitors C3 and C4 will provide an additional path for current flow and thus for an AC current there will be less impedance between C1 and the Tr1 or Tr2 with the result that the charge on C2 will be greater for a given AC current than it would be for the corresponding DC current. Thus the AC current threshold can be set lower than the DC current threshold.

Figure 6:
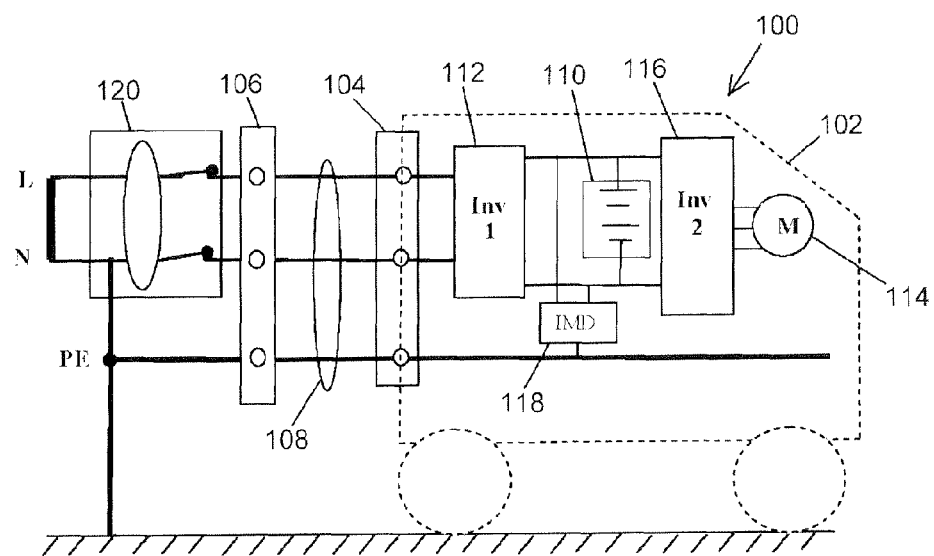
FIGS. 6 and 7 are schematic diagrams of an electric vehicle and a typical arrangement for charging the vehicle.

FIG. 6 is a schematic diagram of an electric vehicle (EV) 100 and a typical arrangement for charging the vehicle.

The EV 100 comprises a body 102 shown in dashed lines having an externally accessible mains connecter 104 through which the EV can be charged from an AC mains socket 106 via a three core cable 108 comprising live L, neutral N and protective earth PE conductors. The mains socket 106 is located in a building, outhouse, garage or other fixed location, not shown.

The EV 100 converts the AC mains supply to DC to charge a battery 110 using an inverter 112. The operation of inverters is well known to those familiar with the art, but basically the inverter chops up the 50 Hz AC mains current at a substantially higher frequency rate (e.g. several KHz) such that each half cycle of the mains supply becomes a high frequency signal within respective positive and negative going half cycles. This gives rise to a multifrequency or high frequency current with a DC component. When it is desired to operate the EV 100 the DC output from the battery 110 is converted back to AC using a second inverter 116 to drive a motor 114.

Generally the DC supply is isolated from the protective earth PE and the EV body 102 to minimize the risk of electric shock in the event of a person touching one side of the DC supply within the EV. An insulation monitoring device (IMD) 118 is normally fitted within the EV to detect an inadvertent connection from the DC supply conductors to the PE, for example due to insulation breakdown. In such a case an audible or visible alarm will be activated. However, the IMD 118 is not a protective device and generally does not prevent the continued use of the EV after an insulation breakdown has occurred. Thus, after a first fault within the EV a shock risk can arise and the user may be exposed to such risk.

In FIG. 6 the EV 100 is connected to a standard TN system single phase 230V/50 Hz AC supply comprising of live, neutral and protective earth conductors. Once the EV is so connected, its body will be at earth potential and shock risks will be minimized. The DC supply within the EV is normally isolated from the EV body. The installation supplying the EV is normally protected by a conventional RCD, shown schematically at 120, which is based on IEC61008 or a GFCI to UL943 with a normal trip current level not exceeding 30 mA.

An RCD based on IEC61008 is required to detect an AC residual current up to its rated trip level, e.g. 30 mA, at rated frequency, e.g. 50 Hz or 60 Hz. Such RCDs are generally blind or non responsive to DC residual currents or currents at substantially higher frequencies than the normal mains supply. Furthermore, the operation of such RCDs may be impaired by the presence of DC residual currents or residual currents at high frequencies or at composite frequencies. Such limitations in the operation of conventional RCDs are accepted because residual currents at DC or at high frequencies or multifrequency residual currents rarely occur in domestic installations. However, the emergence of the EV in the mass market has given rise to a new and potentially hazardous problem.

For example, an insulation breakdown could occur between the DC supply and the earthing system or body of the EV. This condition could occur during normal everyday use of the EV or could occur during the charging process. The IMD 118 will be activated in the event of such a fault. However, if the fault condition is ignored for any reason and the EV is connected to the AC supply a current $I_{dc}$ will flow from the DC conductor through the PE to the supply live and through the RCD 120 as a differential current back to the DC conductor. This current will have DC components and will be at a relatively high frequency as determined by inverter 112. Given that the voltage at the output of inverter 112 can be in the range of several hundred volts, the resultant residual current will be relatively high and in any event substantially higher than the 30 mA rating of the conventional RCD. The effect of $I_{dc}$ will be to desensitize the RCD 120 to such an extent that its normal 50 Hz trip level will be increased well above its rated trip level and thereby impair its ability to provide adequate shock protection against a subsequent 50 Hz residual current.

A second fault condition could occur where a person touches a live part of the AC supply. The resultant residual current $I_{ac}$ will also flow through the RCD 120 but is highly likely to go undetected due to the presence of the first fault current $I_{dc}$. Thus, because of a fault within the EV, the normal protection provided by the RCD 120 has been compromised. A similar problem would arise in the case of a breakdown of the insulation between the output of the inverter 116 and the protective earth. The potential hazard is not confined to the immediate vicinity of the charging circuit. The EV may be connected to a charging circuit outside a house. The house and all socket outlets are protected by a conventional RCD, as is standard practice. When the EV with the insulation breakdown problem is connected to a socket outlet in a garage or car port, the RCD protecting the entire installation will be compromised, and a person touching a live part within the house during the EV charging operation may no longer have the expected shock protection previously afforded by the RCD.

Although an alarm may be activated by the IMD 118 for the first fault within the EV, the user would have no way of realizing that this fault could cause failure of an RCD 120 in an external installation when the EV is connected to that installation. Thus, a shock hazard could be generated within an external installation due to a fault within the EV and conventional solutions would not provide adequate protection. The EV could be left connected overnight or even over a weekend, in which case a sustained shock hazard would arise.

This problem could be overcome by replacing the conventional RCD 120 with a B Type RCD based on IEC62423 which is designed to detect DC residual currents and AC residual currents up to 1 KHz. However, such RCDs are substantially more expensive than conventional RCDs and are therefore unlikely to be used in residential applications. Furthermore, it would not be feasible to replace millions of conventional RCDs worldwide just to mitigate this problem.

The insulation breakdown as described will generally go undetected unless special equipment such as an IMD is fitted within the EV to detect it. Failure of the IMD itself could cause a resultant breakdown in insulation between the DC supply and the PE and possibly cause the very problem that compromises the external RCD. There is no way of ensuring that the user will not connect the EV to an external supply to charge the battery under a fault condition, especially if the user believes the fault and the resultant risks to be contained within the EV, or that there is simply a false alarm.

Figure 7:
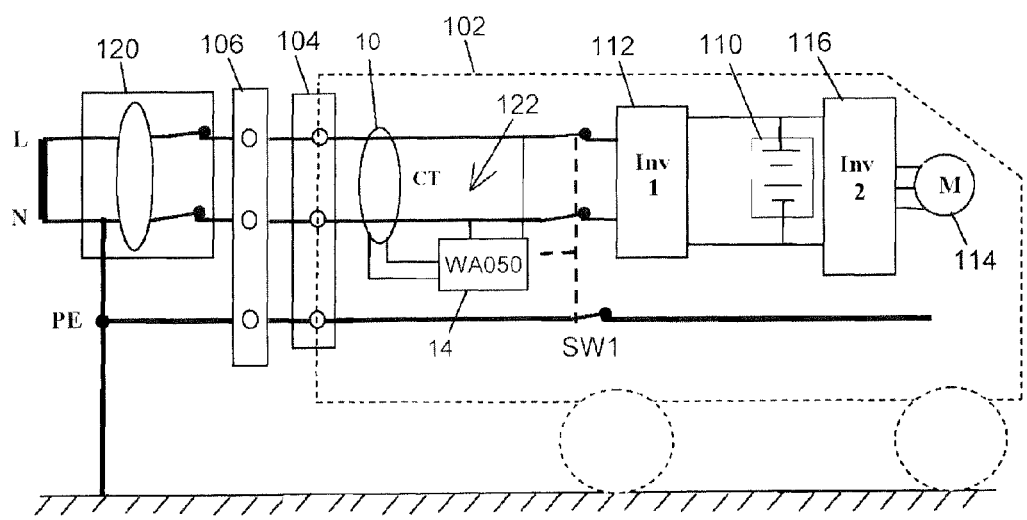

FIG. 7 shows a simple but effective means to mitigate the above problem.

In FIG. 7 a residual current device (RCD) 122 has been fitted within the EV to monitor the current flowing in the PE conductor within the EV. In this arrangement, the RCD 122 is constructed as described in any of the preceding embodiments and uses a current transformer CT having a toroidal core 10 which surrounds the live L and neutral N supply conductors to detect a current imbalance in those conductors indicating a residual current flowing in the PE conductor. In the event that a residual current in excess of a predetermined threshold flows in the PE, the RCD IC (WA050) 14 will produce an output. This output can be used to disconnect the EV from the external supply by opening contacts SW1 in the AC live and neutral conductors, and also advantageously the PE conductor. The shock hazard will then be removed regardless of the actions of the user. (It will be appreciated that the RCD 122 is shown in highly simplified form in FIG. 7, and shows only the toroidal core 10 and the IC 14, all intermediate components being omitted). The RCD 122 is designed to detect residual currents over the range of DC to the highest frequency component produced by the inverter 112. The CT core 10 may encompass the active L and N conductors together as shown in FIG. 7 and detect DC or AC residual current flow in the AC supply to the EV. An alternative option would be for the CT core 10 to encompass the PE conductor alone, but if the body of the EV was externally grounded, the residual current could be split between the PE and the external return path and possibly go undetected.

The invention is not limited to the embodiments described herein which may be modified or varied without departing from the scope of the invention.

The invention claimed is:

1. A circuit for detecting a DC current in at least one conductor, the circuit including:
    a current transformer having a ferromagnetic core, a primary winding comprising the conductor and at least one secondary winding,
    an impedance in series with the secondary winding,
    an oscillator for supplying an oscillating signal across the impedance and the secondary winding and
    means for detecting a dc offset in the current flowing in the impedance and the secondary winding,
    wherein:
    the impedance comprises a first capacitor,
    the current transformer has two secondary windings and the first capacitor is connected in series between the secondary windings, and
    the detecting means is arranged to detect a non-zero voltage across the first capacitor above a certain level, the non-zero voltage corresponding to a dc offset greater than a predetermined magnitude, and
    wherein the detecting means comprises:
    a pair of transistors each of which is turned on in response to a detected non-zero voltage in a respective one of the two opposite directions across the first capacitor,
    a resistance and a second capacitor mutually connected in parallel, the parallel combination of the resistance and second capacitor being connected in series with each transistor so that the second capacitor is charged up when either transistor is turned on, and
    means for monitoring the voltage on the second capacitor.

2. A circuit as claimed in claim 1, wherein the oscillator frequency is at least an order of magnitude higher than mains supply frequency to allow the detection of mains frequency AC currents in the conductor.

3. A circuit as claimed in claim 2, wherein the value of at least one circuit component is selected so that the same DC offset is obtained in respect of AC and DC currents having different RMS values.

4. A circuit as claimed in claim 2, wherein the value of at least one circuit component is selected so that the DC offset obtained in respect of DC currents is substantially greater than that for AC currents of equivalent RMS value.

5. A circuit as claimed in claim 2, wherein the value of at least one circuit component is selected so that the DC offset obtained in respect of DC currents is substantially less than that for AC currents of equivalent RMS value.

6. A circuit as claimed in claim 1, wherein the current transformer comprises an apertured core, the conductor passing through the aperture and the, or each, secondary being a winding on the core.

7. A circuit for detecting a DC current in at least one conductor, the circuit including:
- a current transformer having a ferromagnetic core, a primary winding comprising the conductor, and a secondary winding,
- at least one impedance in series with the secondary winding,
- an oscillator for supplying an oscillating signal across the impedance and the secondary winding, and
- means for detecting a dc offset in the current flowing in the impedance and the secondary winding, wherein:
the at least one impedance comprises a first and second capacitors, the secondary winding is connected in series between the first and second capacitors, and
the detecting means is arranged to detect a non-zero voltage across each of the first and second capacitors above a certain level, the non-zero voltage corresponding to a dc offset greater than a predetermined magnitude, wherein the detecting means comprises:
a pair of transistors each of which is turned on in response to a detected non-zero voltage in a respective one of the two opposite directions across the secondary winding,
a resistance and a third capacitor mutually connected in parallel, the parallel combination of the resistance and third capacitor being connected in series with each transistor so that the third capacitor is charged up when either transistor is turned on, and
means for monitoring the voltage on the third capacitor.

\* \* \* \* \*